United States Patent
Harley et al.

(10) Patent No.: US 9,412,843 B2
(45) Date of Patent: Aug. 9, 2016

(54) METHOD FOR EMBEDDED DIAMOND-SHAPED STRESS ELEMENT

(71) Applicant: International Business Machines Corporation, Armonk, NY (US)

(72) Inventors: Eric C. Harley, Lagrangeville, NY (US); Judson R. Holt, Wappingers Falls, NY (US); Jin Z. Wallner, Albany, NY (US); Thomas A. Wallner, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 14/285,967

(22) Filed: May 23, 2014

(65) Prior Publication Data

US 2015/0340465 A1 Nov. 26, 2015

(51) Int. Cl.
| | |
|---|---|
| H01L 29/78 | (2006.01) |
| H01L 21/336 | (2006.01) |
| H01L 29/66 | (2006.01) |
| H01L 21/308 | (2006.01) |
| H01L 29/08 | (2006.01) |
| H01L 29/165 | (2006.01) |

(52) U.S. Cl.
CPC ........ *H01L 29/66636* (2013.01); *H01L 21/308* (2013.01); *H01L 21/3086* (2013.01); *H01L 29/0847* (2013.01); *H01L 29/6656* (2013.01); *H01L 29/7848* (2013.01); *H01L 29/165* (2013.01); *H01L 29/66545* (2013.01)

(58) Field of Classification Search
CPC .............................. H01L 29/78; H01L 21/336
USPC .......... 438/286, 285, 503, 703, 710; 257/192, 257/19, 57, 213, 369
See application file for complete search history.

(56) References Cited

U.S. PATENT DOCUMENTS

| | | | |
|---|---|---|---|
| 5,681,768 A | 10/1997 | Smayling et al. | |
| 7,553,717 B2 | 6/2009 | Chakravarthi et al. | |
| 7,569,848 B2* | 8/2009 | Belyansky et al. | 257/19 |
| 8,357,573 B2 | 1/2013 | Kronholz et al. | |
| 8,460,980 B2 | 6/2013 | Kronholz et al. | |
| 8,507,386 B2 | 8/2013 | Farber et al. | |
| 2007/0161216 A1* | 7/2007 | Bauer | 438/503 |
| 2008/0237634 A1 | 10/2008 | Dyer et al. | |
| 2009/0032880 A1* | 2/2009 | Kawaguchi et al. | 257/369 |
| 2012/0064686 A1 | 3/2012 | Farber et al. | |
| 2012/0086056 A1 | 4/2012 | Beyer et al. | |
| 2012/0132957 A1* | 5/2012 | Sung et al. | 257/192 |
| 2012/0135576 A1 | 5/2012 | Lee et al. | |
| 2014/0127893 A1* | 5/2014 | Huang | 438/590 |

* cited by examiner

*Primary Examiner* — Sheng Zhu
(74) *Attorney, Agent, or Firm* — Erik K. Johnson; Steven Meyers

(57) ABSTRACT

A method of manufacturing a semiconductor device with an embedded layer, by anisotropically etching a substrate adjacent to an already formed gate structure. A dummy layer is deposited in the previously etched region, and a second spacer is formed next to the first spacer. The dummy layer is removed, and a second anisotropic etch is performed. A semiconductor substrate is then epitaxially grown in the etched out region to form the embedded layer.

20 Claims, 4 Drawing Sheets

METHOD FOR EMBEDDED DIAMOND-SHAPED STRESS ELEMENT

BACKGROUND

The invention relates to semiconductor fabrication, and particularly to fabricating transistor devices having diamond-shaped source and drain regions.

Field effect transistors (FETs) are commonly employed in electronic circuit applications. FETs may include a source region and a drain region spaced apart by a semiconductor channel region. A gate, potentially including a gate dielectric layer, a work function metal layer, and a metal electrode, may be formed above the channel region. By applying voltage to the gate, the conductivity of the channel region may increase and allow current to flow from the source region to the drain region.

Carrier mobility in the channel of a FET device can be improved by applying mechanical stresses to the channel to induce tensile and/or compressive strain in the channel. The application of such mechanical stresses to the channel can modulate device performance and thus improve the characteristics of the FET device. For example, a process-induced tensile strain in the channel of an n-type (NFET) device can create improved electron mobility, leading to higher saturation currents. For p-type FETs (pFETs), compressive stress may be applied.

BRIEF SUMMARY

An embodiment of the invention may include a method of forming a semiconductor structure. The method involves anisotropically etching a semiconductor substrate adjacent to a gate structure with a single spacer to form a recessed region. A dummy layer is deposited to fill the recessed region. A second spacer is formed above the dummy layer and adjacent to the first spacer. Following the formation of the second spacer, the dummy layer is removed. A second anisotropic etch is performed to form a recessed source/drain region. A source/drain region is then epitaxially grown in the recessed source/drain region.

An embodiment of the invention may include a method of forming a semiconductor structure. The method involves anisotropically etching a semiconductor substrate along a vertical plane adjacent to a gate structure with a single spacer to form a recessed region. A dummy layer is deposited to fill the recessed region. A second spacer is formed above the dummy layer and adjacent to the first spacer. Following the formation of the second spacer, the dummy layer is removed. A second anisotropic etch along the <111> plane is performed to form a recessed source/drain region. A source/drain region is then epitaxially grown in the recessed source/drain region.

BRIEF DESCRIPTION OF THE SEVERAL DRAWINGS

Figure 7:
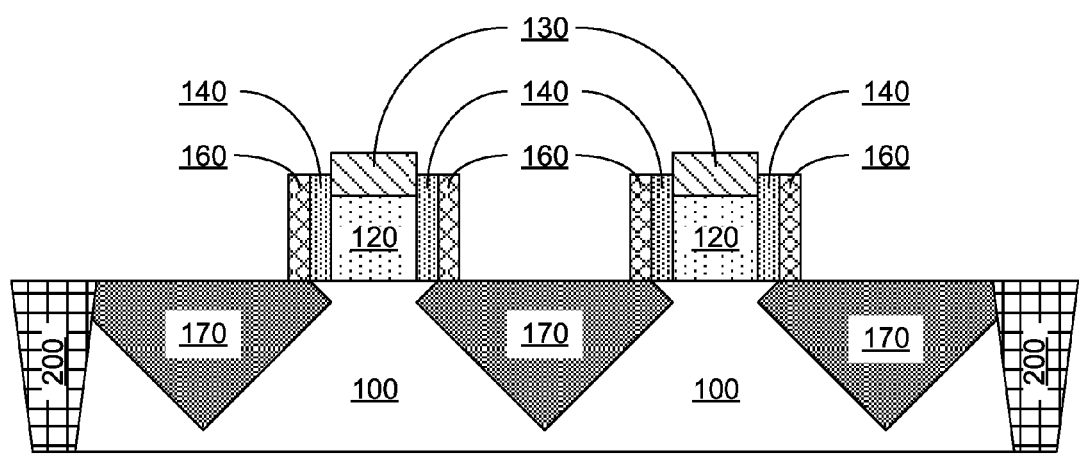

FIG. 7 is a cross sectional view depicting deposition of a diamond shaped strain layer, according to an exemplary embodiment; and Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embedded source/drain regions may be employed as a means for effecting performance of field effect transistor (FET). Replacing the semiconductor substrate in source/drain regions with another material may lower the resistance of the source/drain region, as well as affect contact resistance. By creating an embedded source/drain region, a sharp material gradient is formed between the source/drain region and the channel region underneath the gate. Additionally, carrier mobility in the channel region of a FET may be increased by applying a stress, for example tensile in n-type FET (nFET) or compressive stress in p-type FET (pFET), to the channel region. The stress may be induced to the channel region of a FET by positioning a well trench composed of a stress inducing material, for example a stress inducing source region and/or a stress inducing drain region, adjacent to the channel region of the FET. To increase the stress in the channel region produced by the stress inducing source and drain regions, and reduce the resistance of the source and drain regions, the stress inducing source and drain regions may be positioned as close as possible to the channel region. Variation in the position of source/drain regions may lead to unwanted changes in voltage across the channel due to changes in proximity of the source/drain regions, as well as strain across the channel.

The final position of a corner or edge of the source/drain region may depend on the dimensions of an undercut prior to anisotropically etching the strain region. Having knowledge of the dimensions of the undercut prior to the formation of the source/drain regions may allow for consistent control of the placement of the source/drain regions. Previous methods of formation of the undercut region relied on a timed isotropic etch, but created an undercut which may experience variation with respect to how close the undercut came to the channel underneath the gate. As growth rates for gate spacers may be predictable, a first spacer may be grown to a predetermined width prior to anisotropically etching away the base substrate to form an undercut with known dimensions. Subsequently, the source and drain regions may be etched to a predetermined shape, which may allow for consistent control of the placement of the stress inducing source and drain regions throughout a single chip, and across different chips made in different batches. Such predictability may allow for increased performance because one may be able to precisely control the location and shape of the stress inducing source and drain regions.

Figure 1:
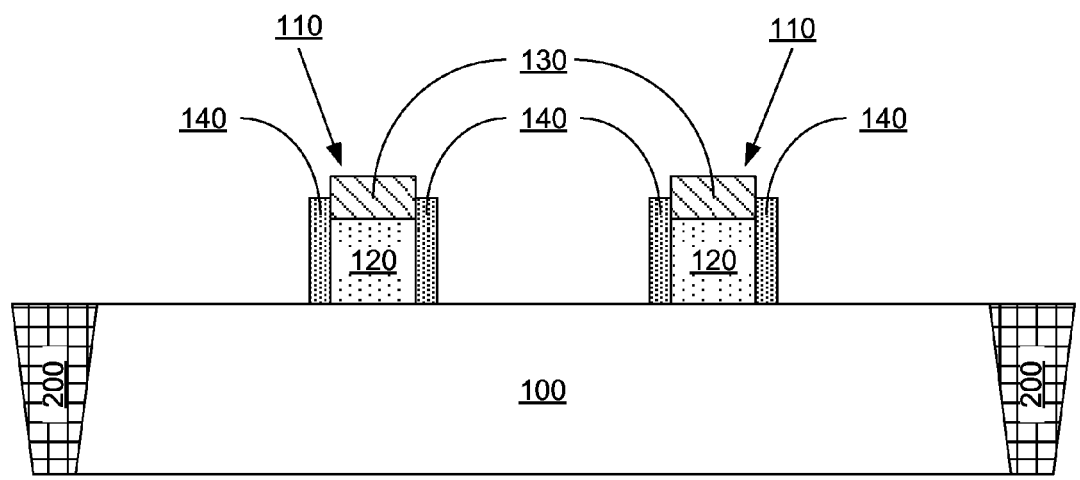
FIG. 1 is a cross sectional view depicting a FET gate structure, according to an exemplary embodiment.

Referring to FIG. 1, a gate 110 may be provided on a substrate 100. The substrate 100 may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. In some embodiments, the substrate 100 may be a bulk semiconductor substrate. In such embodiments, the substrate 100 may be approximately, but is not limited to, several hundred microns thick. For example, the substrate 100 may have a thickness ranging from approximately 0.5 mm to approximately 1.5 mm. In other embodiments, the substrate 100 may be a semiconductor-on-insulator (SOI) substrate (not shown). Additionally, isolation regions 200 may separate the gate 110 from other devices on the substrate (not shown). The isolation regions 200 may be, for example, shallow trench isolation (STI) regions and made of any insulating material, such as silicon nitride, silicon oxide, silicon oxynitrides, or a combination thereof.

Still referring to FIG. 1, the gate 110 may include a gate stack 120, a hard mask 130 and first spacers 140. The gate stack 120 may include any arrangement of layers known in the art. For example, the gate stack 120 may contain at least a gate dielectric layer (not shown) and a gate electrode on the gate dielectric layer (not shown) that may be formed via any known process in the art, including a gate-first process and a gate-last process.

In a gate-first process, the gate dielectric layer may include any suitable insulating material including, but not limited to oxides, nitrides, oxynitrides or silicates including metal silicates and nitrided metal silicates. In one embodiment, the gate dielectric may include a high-k oxide such as, for example, silicon oxide ($Si_xO_y$), hafnium oxide ($Hf_xO_y$), zirconium oxide ($Zr_xO_y$), aluminum oxide ($Al_xO_y$), titanium oxide ($Ti_xO_y$), lanthanum oxide ($La_xO_y$), strontium titanium oxide ($Sr_xTi_yO_z$), lanthanum aluminum oxide ($La_xAl_yO_z$), and mixtures thereof. The gate dielectric layer may be deposited using any suitable deposition technique known the art, including, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD). The gate electrode may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The gate electrode may be formed using any suitable metal deposition technique, including, for example, CVD, PVD, and ALD, sputtering, and plating.

In a gate-last process, the gate stack 120 may include a sacrificial gate (not shown) that may be later removed and replaced by a gate dielectric layer and a gate electrode such as those of the gate-first process described above. In an exemplary embodiment, the sacrificial gate may be made of a polysilicon material with a sacrificial dielectric material (e.g. silicon oxide) formed using known deposition techniques known in the art, including, for example, ALD, CVD, PVD, MBD, PLD, LSMCD, sputtering, and plating. Other suitable materials and methods of forming a sacrificial gate are known in the art.

The hard mask 130 may be formed above the gate stack 120 to protect the gate stack 120 during subsequent fabrication processes. The hard mask 130 may be made of an insulating material, such as, for example, silicon nitride, silicon oxide, silicon oxynitrides, or a combination thereof. The hard mask 130 may have a thickness ranging from approximately 20 nm to approximately 50 nm, and may be formed by any suitable deposition technique known in the art, including ALD, CVD, PVD, MBD, PLD, or LSMCD.

The first spacers 140 may be made of any insulating material, such as silicon nitride, silicon oxide, silicon oxynitrides, or a combination thereof, and may have a thickness ranging from 2 nm to approximately 100 nm, preferably approximately 2 nm to approximately 25 nm. The first spacers 140 may be made of the same material as the hard mask 130. In an exemplary embodiment, the hard mask 130 and the first spacers 140 may be made of silicon nitride.

Figure 2:
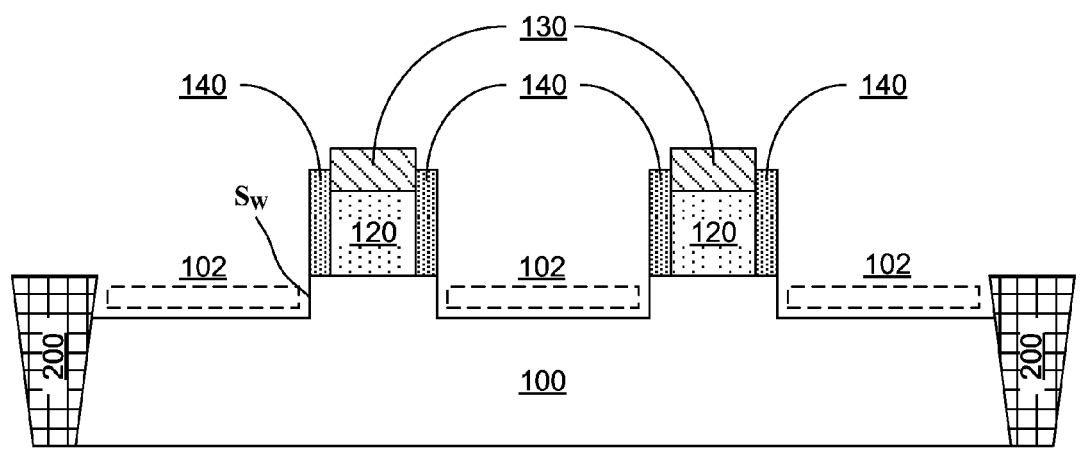
FIG. 2 is a cross sectional view depicting anisotropically etching the semiconductor substrate, according to an exemplary embodiment.

Referring to FIG. 2, the substrate 100 may be anisotropically etched to create intermediate recesses 102 in the substrate 100 adjacent to the gate structure 110. The anisotropic etch performed may selectively etch material along the vertical axis, while having little effect on material horizontal to the etched out region. For example, the anisotropic etch may only remove material where the substrate 100 is left uncovered by the gate 110, and create an intermediate recess 102 wherein the sidewall Sw is substantially planar or even to the outer edge of the first spacers 140. The intermediate recesses 102 may extend from an outer edge of the first spacers 140 to the adjacent isolation region 200, if present. The anisotropic etch may allow for a predictable and reliable definition of the edge of the intermediate recesses 102 nearest to the gate 110. The anisotropic etch may be performed by wet silicon etching, or plasma etching.

Figure 3:
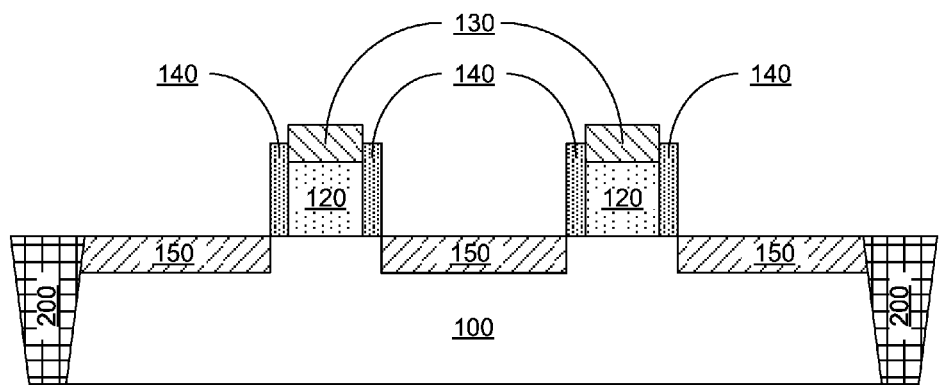
FIG. 3 is a cross sectional view depicting depositing a dummy layer, according to an exemplary embodiment.

Referring to FIG. 3, the intermediate recesses 102 (FIG. 2) may be filled with dummy layers 150. The dummy layers 150 may act as a surface to define the bottom of additional spacers formed on the gate 110. The dummy layers 150 may be any material that may be selectively etched without substantially damaging the substrate 100, the gate 110 or the isolation regions 200. In an exemplary embodiment, the dummy layers 150 may be made of germanium or an alloy with a high germanium concentration, for example, at least approximately 20 atomic %, and a silicon concentration below approximately 80%. Dummy layer 150 may be formed by selective epitaxial growth.

Figure 4:
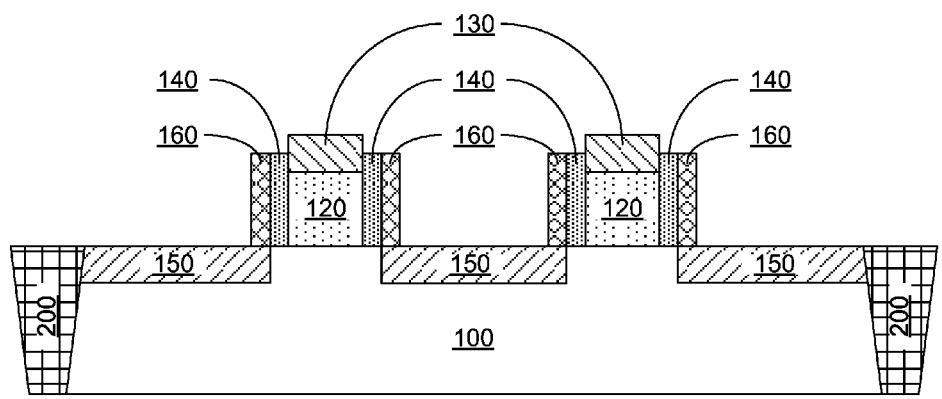
FIG. 4 is a cross sectional view depicting forming a second spacer, according to an exemplary embodiment.

Referring to FIG. 4, second spacers 160 may be formed on the outside of the first spacers 140, above the dummy layers 150. The second spacers 160 may be made of any insulating material, such as silicon nitride, silicon oxide, silicon oxynitrides, or a combination thereof, and may have a thickness ranging from 2 nm to approximately 100 nm, preferably approximately 2 nm to approximately 25 nm. The second spacers 160 may be formed by any method known in the art, including depositing a conformal silicon nitride layer over the gate 110 and removing unwanted material using an anisotropic etching process such as, for example, reactive ion etching (RIE) or plasma etching (not shown). Methods of forming spacers are well-known in the art and other methods are explicitly contemplated.

Figure 5:
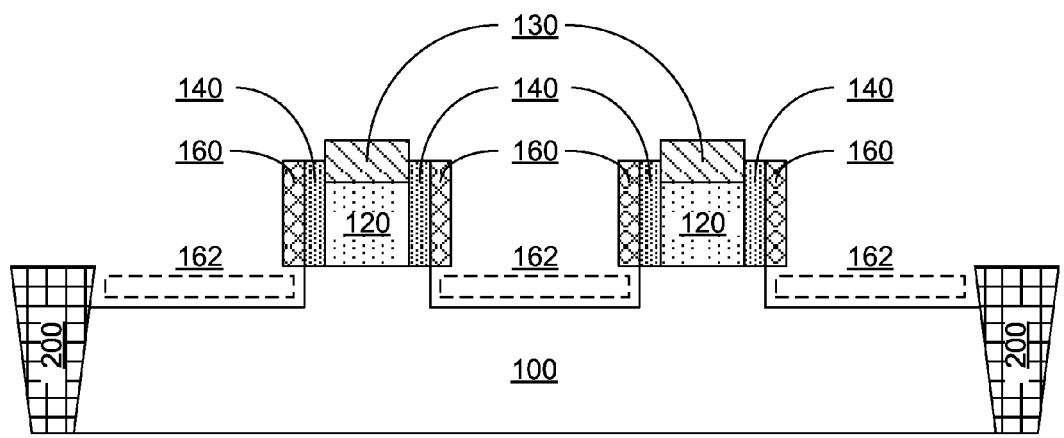
FIG. 5 is a cross sectional view depicting removing the dummy layer, according to an exemplary embodiment.

Referring to FIG. 5, the dummy layers 150 may be removed to form undercut recesses 162 by selective etching process capable of removing the dummy layer without substantially damaging the substrate 100, the gate 110 or the isolation regions 200. In an exemplary embodiment, the dummy layer 150 made from germanium may be removed with hydrogen peroxide, ammonium hydroxide, TMAH, KOH, or other PH basic etchant.

Figure 6:
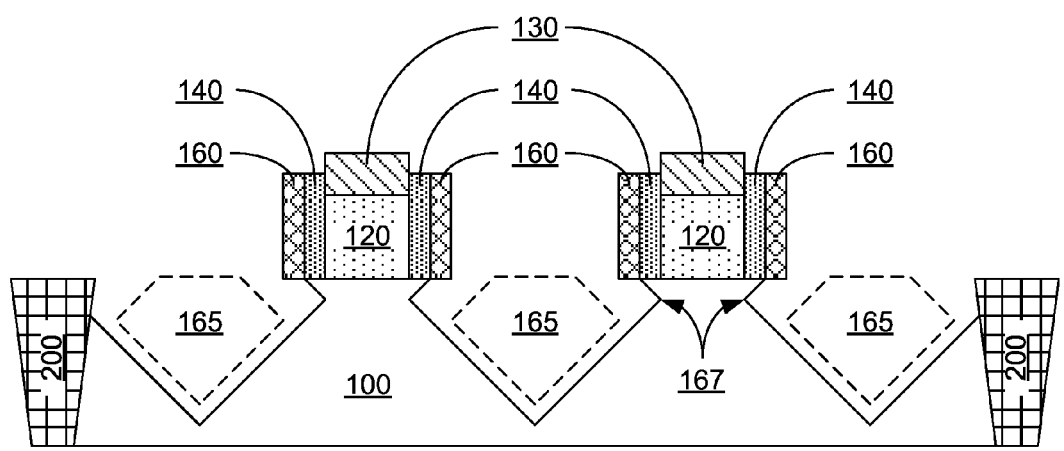
FIG. 6 is a cross sectional view depicting anisotropic etching to form a diamond shaped recess, according to an exemplary embodiment.

Referring to FIG. 6, the substrate 100 may be anisotropically recessed to form source/drain recesses 165. The source/drain recesses 165 may take on any shape such as, for example, a diamond shape or a region with a substantially flat bottom. Additionally, the source/drain recesses 165 may contain an angled recessed region 167. Precise placement of the angled recessed region 167 may be beneficial to device performance, as small (0.1 nm) changes could lead to relatively large changes in voltage across the channel. By precisely defining the undercut recess 162, anisotropically etching the source/drain recesses 165 can lead to a predictable and repeatable placement of the angled recessed region 167. The substrate 100 may be etched to form the angled recessed corner 167 beneath the first spacers 140. In some embodiments, the angled recessed region 167 may extend beneath the gate 110. The angled recessed region 167 may be v-shaped, as depicted in FIG. 6. In other embodiments, the angled recessed region 167 may have a sigma-shaped recess, with an approximately vertical sidewall connecting the two angled faces of the recess (not shown).

Prior to etching the substrate 100 may have a <110> crystal lattice structure, which will etch faster than planes having a <111> crystal lattice structure. As the etch progresses, the <110> plane of the substrate 100 may be etched away to expose <111> planes angled inward away from the substrate 100. These <111> planes may form the boundary of the angled recess region 167. If the etch proceeds to the point where the <111> planes intersect, then the angled recess region 167 may be v-shaped. Otherwise, the angled recess region 167 may be sigma-shaped.

In an exemplary embodiment, the angled recessed region 167 may be formed by a timed wet or gaseous etch process using, for example, tetramethylammonium hydroxide (TMAH). In other embodiments, gaseous hydrogen chloride (HCl) may be used in lieu of, or in addition to TMAH. The duration of the etch process may determine the depth and shape of the angled recessed corner 167. In an exemplary embodiment, approximately 300 sccm HCl gas in approximately 35 slm of a carrier gas, such as hydrogen, may be flowed into a process chamber at approximately 650° C. for a time ranging from approximately 10 seconds to approximately 30 seconds. The etch time may be less than 10 seconds or greater than 30 seconds depending on the other etch process parameters, including etchant (e.g., HCl or TMAH) flow rate, carrier gas flow rate, and temperature.

Referring to FIG. 7, a strain material 170 may be deposited into source/drain recesses 165 (FIG. 6). The strain material 170 may be any material that has a larger or smaller lattice constant than that of crystalline silicon, and thus introduces strain into the substrate 100 when grown in the source/drain recesses 165 of the substrate 100. In an exemplary embodiment, the strain material 170 may be silicon-germanium. In such embodiment, the silicon germanium material may contain, for example, approximately 20% to approximately 100% germanium, approximately 0% to approximately 80% silicon, and may be doped with p-type dopants such as boron in concentrations ranging from approximately $1 \times 10^{20}$ atoms/cm$^3$ to approximately $2 \times 10^{21}$ atoms/cm$^3$. In other exemplary embodiments, the strain material 170 may be carbon doped silicon. In such embodiment, the silicon germanium material may contain, for example, approximately 0.5% to approximately 2.5% carbon, approximately 97.5% to approximately 99.5% silicon, and may be doped with n-type dopants such as arsenic or phosphorus in concentrations ranging from approximately $1 \times 10^{20}$ atoms/cm$^3$ to approximately $2 \times 10^{21}$ atoms/cm$^3$. The strain material 170 may be epitaxially grown in source/drain recesses 165.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Introduction of stress into the channel region of a semiconductor may enhance charge mobility across the semiconductor. Further, precise placement of the source/drain recesses 165 may be beneficial because the predictability of placement may allow the angled recessed corner 167 to be placed in a predetermined and repeatable position for each gate on a semiconductor chip, and between each semiconductor chip. This may lead to better device performance, as the position for the angled recessed corner 167 may be placed in an optimal position without fear that variability will inhibit device performance. Such placement may allow for control of where sharp material gradients are located, which may allow improved control of strain across the channel, as well as control for the amount of resistance in the source/drain regions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor structure, the method comprising:
    performing a first etch, wherein the first etch comprises anisotropically etching a region of a semiconductor substrate adjacent to a gate to form a recessed region in the semiconductor substrate, wherein the gate comprises a gate stack, and a pair of first spacers sandwiching the gate stack;
    forming a dummy layer in the recessed region of the semiconductor substrate;
    forming a pair of second spacers adjacent to the pair of first spacer, wherein a bottom surface of the pair of second spacers is defined by a top surface of the dummy layer;
    removing all of the dummy layer;
    performing a second etch, wherein the second etch comprises anisotropically etching the semiconductor substrate such that a recessed source/drain region extends underneath the dielectric spacers; and
    epitaxially growing a source/drain region in the recessed source/drain region of the semiconductor substrate.

2. The method of claim 1, wherein the first etch comprises a anisotropic etch along the vertical plane of the substrate.

3. The method of claim 2, wherein the vertical anisotropic etch comprises wet silicon etching or plasma etching.

4. The method of claim 1, wherein the second etch comprises an anisotropic etch along the <111> plane of the substrate.

5. The method of claim 4, wherein the second etch comprises a gaseous etch process.

6. The method of claim 1, wherein the material of the source/drain region is a material with a larger lattice constant than silicon.

7. The method of claim 6, wherein the material of the source/drain region is silicon germanium.

8. The method of claim 1, wherein the material of the source/drain region is a material with a smaller lattice constant than silicon.

9. The method of claim 6, wherein the material of the source/drain region is carbon doped silicon.

10. The method of claim 1, wherein the recessed region is a diamond shaped recess or a sigma recess.

11. The method of claim 1, wherein the dummy layer material comprises germanium.

12. The method of claim 1, wherein forming the dummy later further comprises completely filling the recessed region.

13. The method of claim 1, wherein a vertical surface of the recessed region adjacent to the gate is substantially coplanar to the outer edge of the first spacer pair.

14. A method of forming a semiconductor structure, the method comprising:
    performing a first etch, wherein the first etch comprises anisotropically etching a region of a semiconductor substrate adjacent to a gate to form a recessed region in the semiconductor substrate, wherein the gate comprises a gate stack, and a pair of first spacers sandwiching the gate stack, wherein the first etch comprises an anisotropic etch along a vertical plane of the substrate;
    forming a dummy layer in the recessed region of the semiconductor substrate;
    forming a pair of second spacers adjacent to the pair of first spacer, wherein a bottom surface of the pair of second spacers is defined by a top surface of the dummy layer;
    removing all of the dummy layer;
    performing a second etch to form a recessed source/drain region, wherein the second etch comprises an anisotropic etch along the <111> plane of the substrate; and
    epitaxially growing a source/drain region in the recessed source/drain region of the semiconductor substrate.

15. The method of claim 14, wherein the first etch comprises wet silicon etching or plasma etching.

16. The method of claim 14, wherein the second etch comprises a gaseous etch process.

17. The method of claim 14, wherein the material of the source/drain region is a material with a larger lattice constant than silicon.

18. The method of claim 17, wherein the material of the source/drain region is silicon germanium.

19. The method of claim 14, wherein the material of the source/drain region is a material with a smaller lattice constant than silicon.

20. The method of claim 14, wherein the material of the source/drain region is carbon doped silicon.

* * * * *